United States Patent [19]

Schulze, Sr.

[11] 4,186,563

[45] Feb. 5, 1980

[54] COOLING EFFICIENCY METER CIRCUIT FOR AN AIR CONDITIONER

[75] Inventor: James L. Schulze, Sr., Middletown, Ky.

[73] Assignee: General Electric Company, Louisville, Ky.

[21] Appl. No.: 898,739

[22] Filed: Apr. 24, 1978

[51] Int. Cl.$^2$ .................... F25B 49/00; G05D 23/00
[52] U.S. Cl. ..................................... 62/126; 165/11; 236/94; 73/193 R
[58] Field of Search .................. 62/126, 125; 165/11; 236/94; 73/193 R

[56] References Cited

U.S. PATENT DOCUMENTS

| | | | |
|---|---|---|---|
| 2,720,090 | 10/1955 | Ford | 62/129 |
| 3,635,282 | 1/1972 | Watanabe | 165/11 |
| 3,707,851 | 1/1973 | McAshan, Jr. | 62/125 |
| 3,729,051 | 4/1973 | Mannion | 165/22 |
| 3,995,686 | 12/1976 | Laube | 236/94 X |
| 4,049,044 | 9/1977 | Cohen | 165/11 |

Primary Examiner—William E. Wayner
Attorney, Agent, or Firm—Frank P. Giacalone; Radford M. Reams

[57] ABSTRACT

A circuit containing a plurality of fixed detector resistors and a detector potentiometer, each being representative of the contribution to energy consumption of a different operator controllable parameter of an air conditioner and being series connected with one another across a d.c. galvanometer and meter sensitivity resistor. Shorting switches are connected across each of the detector resistors, the conditions of which switches are responsive to the conditions of corresponding switchable parameters such as fan speed, vent door position, etc. A slide arm of the potentiometer is responsive to thermostat operating temperature setting. The resistance values of each detector resistor and the potentiometer are selected to contribute approximately the same percentage resistance to the total resistance of the detectors as a change in the status of its corresponding control parameter contributes to air conditioner operating cost efficiency. The meter provides an analog display of long term energy consumption and energy changes caused by changes in the control parameters.

4 Claims, 1 Drawing Figure

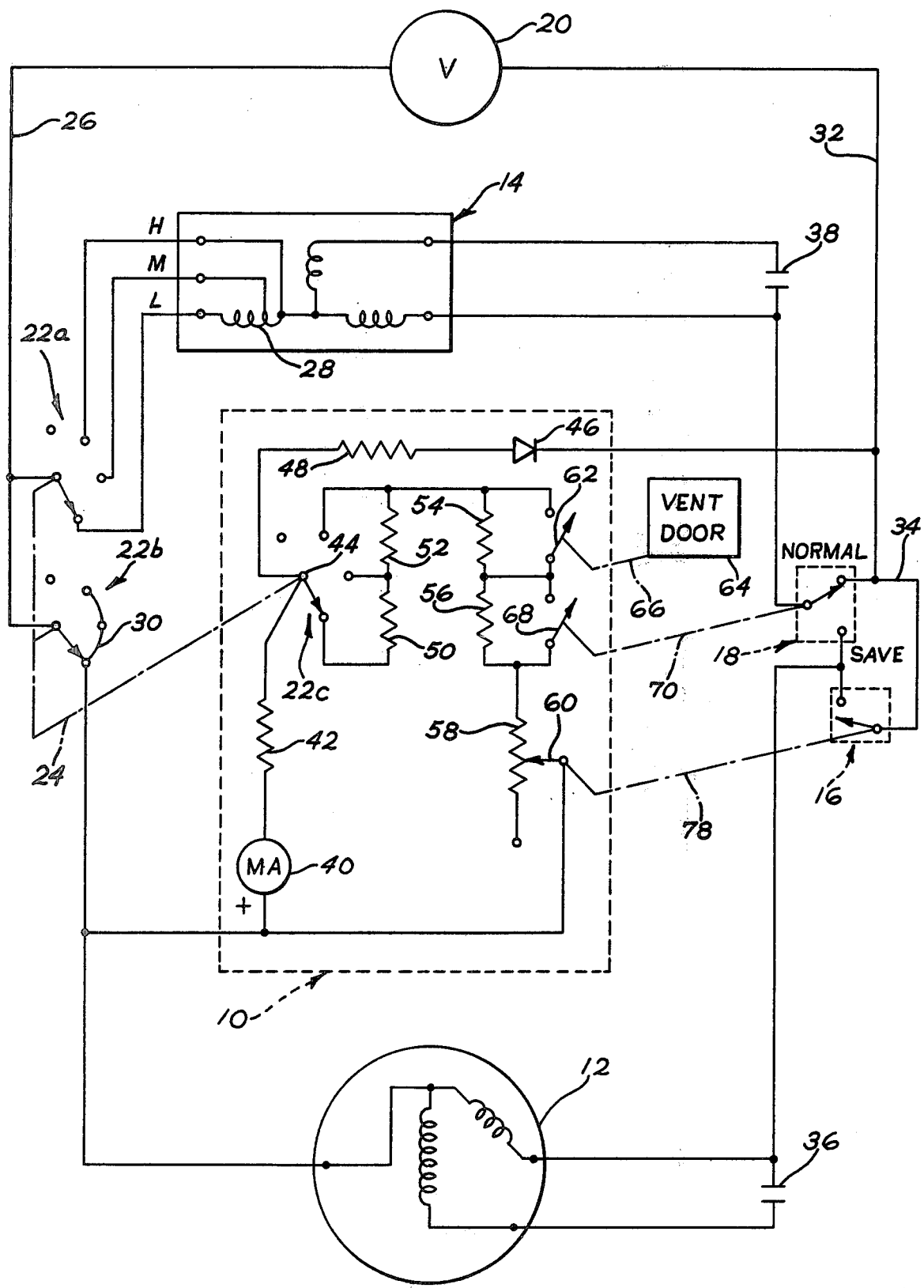

COOLING EFFICIENCY METER CIRCUIT FOR AN AIR CONDITIONER

BACKGROUND OF THE INVENTION

This invention relates generally to a cooling efficiency meter and associated circuitry for use in monitoring relative changes in the long term energy consumption of an air conditioner system occasioned by the making of manual adjustments in the operating controls of the system.

In recent years, there has been a growing demand for conservation of electrical energy because of the impact of such consumption upon coal and other natural resources, environmental quality and costs. While consumers of electrical power are generally concerned about all these factors, a direct and immediate concern to all is the purchase cost of such energy. A major energy consuming facility in modern homes, offices and other buildings is the air conditioner. It is, therefore, of particular importance that such facilities be operated in the most cost efficient manner possible, consistent with the minimum comfort requirements of their users. To accomplish this, it is necessary to detect changes in the operator controllable parameters of the facility which have a substantial impact upon long term energy consumption such as changes in thermostat settings, fan motor speed, vent door openings and closings, and so on. By "long term" energy consumption is meant that energy consumption which can have recognizable impact upon the users' monthly utility bill as opposed to momentary or short term energy consumption which, while momentarily affecting the power drawn by the facility, has little if any adverse effect upon such utility costs.

One prior art device generally pertinent to this subject is that disclosed in U.S. Pat. No. 4,049,044 issued to D. J. Cohen on Sept. 20, 1977 entitled Heat and Cooling System Consumption Meter. That device is a monitor for heating and cooling energy consumed by a unit of a multi-unit apartment or office building and is responsive to thermostat settings and blower speeds. A digital pulse generator is coupled to an integrating circuit which, in turn, generates an extended pulse which is thereafter amplified and transmitted to a pulse counter.

One problem encountered with such prior art devices is the relative complexity of the circuit in terms of the number and variety of components employed. Another problem encountered is that the pulse counter can not operate when the thermostat contacts are open, whereby energy consumed by the facility resulting from continuous fan operation is not detectable when the compressor is inoperative. Moreover, since the subject device indicates that energy consumption increases proportionally as fan speed is increased, the device is a monitor of momentary or short term energy consumption rather than long term energy consumption such that it may not accurately represent cost efficiency under all possible variations of the operator control functions. For example, while increases in the speed of the fan motor will increase the momentary power drain of the air conditioner, the improved efficiency of heat exchanger operation caused by increased fan speed will reduce the running time for the compressor for a given thermostat setting resulting in an actual reduction in the long term energy consumption.

The device of my invention substantially overcomes such difficulties and inaccuracies typically encountered in prior art monitoring systems.

SUMMARY OF THE INVENTION

It is an object of the present invention to provide a cooling efficiency detector for an air conditioning facility which monitors all of the manually adjustable operating parameters of the facility which can have an effect upon long term energy consumption.

It is a further object of my invention to provide a relatively accurate and linear cooling efficiency meter circuit for air conditioners to aid the user in obtaining the most cost efficient operation thereof consistent with the users' minimum comfort requirements.

It is yet another object of my invention to provide a cooling efficiency meter circuit adapted for analog display which contains relatively few components.

Briefly, in accordance with my invention, there is provided a cooling efficiency circuit for an air conditioner of the type having a plurality of manually adjustable parameters, changes in which parameters result in changes in the long term energy consumption of the air conditioner. The circuit includes means for detecting the status of each of the parameters and integrating means responsive to the detecting means, for generating a signal representative of the combined effects of each parameter upon such energy consumption. Lastly, a means for displaying the signal is provided, for indicating a change in the energy consumption caused by a change in the status of the parameters.

These and other objects of the subject invention will become apparent to those skilled in the art from the following detailed description and attached drawing upon which, by way of example, only the preferred embodiment of my invention is illustrated.

BRIEF DESCRIPTION OF THE DRAWING

The FIGURE shows a schematic diagram of a cooling efficiency circuit for an air conditioner facility.

DESCRIPTION OF THE PREFERRED EMBODIMENT

Referring now to the drawing, there is shown in one preferred embodiment of my invention, a novel efficiency meter circuit 10 for a conventional air conditioner of the type having a compressor 12, a three-speed fan motor 14, a manually adjustable thermostat 16, and a power saver switch 18.

The unit is powered from a suitable source 20 such as, for example, the usual commercially available 120 volt, 60 cycle a.c. source as found in most homes. A suitable main switch is employed to apply power from the source 20 to the circuit 10, compressor 12 and fan motor 14. One simplified version of a suitable main switch as shown for illustrative purposes in the present example, is a 4-position switch having 3 mechanically linked sections 22a, b and c. Such mechanical linkage is designated by dashed lines 24.

The switch section 22a controls the application of one line 26 from the source 20 to the low, medium and high speed taps L, M and H, respectively, of a stator winding 28 of the fan motor 14. The switch section 22b controls the application of the same line 26 to one side of the circuit 10 and compressor 12. In the present example, three positions of the switch section 22b, which correspond to the high, medium and low speed positions of switch section 22a, are interconnected by a jumper 30 so that power may be applied to the compressor 12 regardless of the speed setting of the section 22a. A fourth corresponding position of the sections 22a, b represents an off position wherein the compressor 12 and fan motor 14 are removed from the source 20.

The other side of the source 20 is applicable to the other side of the compressor 12 through a line 32 and a line 34 when the thermostat 16 is closed. The line 32 also applies the other side of the source 20 to the other side of the fan motor 14 through the power saver switch 18. Accordingly, when the switch 18 is in its "Normal" position as shown, the fan motor 14 can be made to run at all times regardless of whether the compressor 12 is operative. On the other hand, when the switch 18 is placed in its "Save" position, the fan motor 14 is operative only when the compressor 12 is operative. The compressor 12 and fan motor 14, being induction motors in the usual case, employ capacitors 36 and 38, respectively, to provide starting torque and power factor correction in the usual well known manner.

Referring now to the meter efficiency circuit 10, a d.c. milliameter 40 is connected in series with a meter sensitivity resistor 42, the combination of which is connected between the jumpered positions of switch section 22b and a switch arm terminal 44 of the switch section 22c. Direct current is provided to operate the circuit 10 and the meter 40 by means of a diode 46 and current limiting bias resistor 48 series connected between line 32 and the switch arm terminal 44.

In parallel with the meter 40 and sensitivity resistor 42 through the switch section 22c, is a series combination of resistors, specifically a pair of fan speed detector resistors 50 and 52, a vent door detector resistor 54, a power saver switch detector resistor 56 and a thermostat detector potentiometer 58. A slide arm 60 of the potentiometer 58 is connected back to the meter 40 and switch section 22b to complete the parallel combination contained in the circuit 10.

In the present example, the fan motor 14 is always operative when the compressor 12 is operative. In such a case, an increase in speed of the fan motor 14 increases the efficiency of the cooling system since air flow is increased across the heat exchanger, not shown, of the air conditioner. Therefore, the fan speed detector resistors 50, 52 are arranged so as to be successively switched out of the circuit 10 by action of the switch section 22c as it tracks the fan motor speed switch section 22a as the latter is moved from its low speed position L, to the medium speed position M, and then to the high speed position H. Accordingly, the successive removal of the resistors 50 and 52 from the circuit 10 will produce successively reduced deflections of the meter 40 as the speed of the fan motor 14 is increased, indicative of increasing efficiency of operation or reduced long term power consumption of the air conditioner.

In parallel with the vent door detector resistor 54 is a switch 62 such as a spring return type door interlock switch or any other suitable type responsively linked to a vent door 64 of the air conditioner such that the switch 62 will close to shunt the resistor 54 out of the circuit 10 when the vent door 64 is closed. The mechanical linkage between the switch 62 and vent door 64 is represented by a dashed line 66. When the vent door 64 is opened, such being a state of reduced efficiency, since the air conditioner must then also cool high temperature outdoor air being drawn therein, the switch 62 will open to place the resistor 54 in the circuit 10. The removal of the resistor 54 from the circuit 10 will, in turn, cause a decrease in the deflection of the meter 40 indicative of a decrease in long term power consumption of the system resulting from closing the vent door 64.

A switch 68 is connected across the power saver detector resistor 56 and is responsively linked to the power saver switch 18, as indicated by a dashed line 70, such that the switch 68 is open, as shown, when the power saver switch 18 is in its Normal operating position as shown. This is the least efficient state of the power saver switch 18 since, in this position, the fan 14 runs at all times regardless of whether the compressor 12 is running. Accordingly, addition of the resistor 56 to the circuit 10 produced by the normal status of the switch 18 causes an increased deflection of the meter 40 over that obtained when the switch 18 is in its Save position.

The slide arm 60 of the potentiometer 58 is responsively linked in any suitable manner to the manual setting of the thermostat 16 such that the resistance added to the circuit 10 by the potentiometer 58 will increase as the thermostat operating temperature is reduced. Since a reduction in the setting of the thermostat 16 to cause the air conditioner to cool a room to a lower temperature will result in longer running time for the compressor 12, such a reduction will produce a substantial increase in long term power consumption of the system. This increase in power consumption, being represented by a corresponding increase in resistance added to the circuit 10 by the potentiometer 58, will be accompanied by a corresponding increase in the deflection of the meter 40.

Note that in the present example of my invention, there is provided specific detector circuitry for each of the air conditioner controllable parameters which affect the long term power consumption of an air conditioner that may be altered at the pleasure of the operator. In the present case, changes in long term power consumption resulting from changes in the fan motor speed, vent door status, power saver status, and thermostat setting are monitored to give the operator a clear and rapid indication of how changes in each of these parameters affects overall power consumption and, thus, the cost of operating the system on a long term basis, such as throughout an entire air conditioning season.

While it is preferable to include a detector resistor in the circuit of my invention for each of the operator controllable parameters which have an effect upon long term energy consumption, the circuit may be simplified for monitoring selected ones of such parameters. If, for example, it is not desired to monitor the effect of vent door status upon air conditioner efficiency, the vent door detector resistor 54 and its associated switch 62 can simply be removed from the circuit 10 leaving the remaining detector resistors and their associated switches in series with one another across the meter 40 and sensitivity resistor 42. Also, since some air conditioners do not have a power saver switch, the circuit 10 can be modified for use therewith simply by removing the power saver detector resistor 56 and its associated switch 68 from the circuit, leaving the remaining detector resistors in series with one another across the meter 40 and sensitivity resistor 42. Conversely, should additional operator controllable parameters become available on future air conditioner units which also have measurable effects upon long range efficiency and operating costs, additional detector resistances with associated shorting switches or additional potentiometers, similar to the thermostat potentiometer 58, can be added in series with the detector resistors of the circuit 10.

In determining the resistance values for the detector resistances of the circuit 10, it is first necessary to determine by laboratory analysis the percentage effect that maximum changes in each controllable parameter will have upon the long range energy consumption of a given air conditioner. The most inefficient setting of all of the operator controllable parameters should yield full scale deflection on the meter 40. The most inefficient setting of such parameters in the present example would occur when the fan speed switch 22a is set in the low fan speed position L, when the power saver switch 18 is in the "Normal" position, when the vent door 64 is open and when the thermostat 16 is set at its lowest temperature.

Conversely, zero deflection on the meter 40 should be representative of the highest possible cost savings to the operator, i.e. when the air conditioner main switch is turned off. Between these two extremes, deflection levels of the meter 40 should approximately represent the overall level of long term efficiency or energy consumption of the air conditioner corresponding to the various settings of the operator controlled parameters. For example, if it has been determined by laboratory analysis that opening of the vent door of a given air conditioner increases the long term energy consumption level of that air conditioner on the average of three percent over that obtained when the vent door is closed, then the resistance value of the vent detector resistor 54 should be such that, when the switch 66 is open, deflection of the meter 40 increases approximately 3 percent above its deflection level when the vent door 64 is closed.

The following table lists component values suitable for the circuit 10 when used in association with a General Electric Model DE 914, 14,000 BTU/hr. window air conditioner.

TABLE I

| COMPONENT | VALUE |
| --- | --- |
| Meter 40 | Full scale deflection at 150 microamp. d.c., 1500 ohms internal resistance |
| Bias Resistor 48 | 30 K ohms |
| Sensitivity resistor 42 | 33 K ohms |
| Fan speed detector 50 | 100 ohms |
| Fan speed detector 52 | 100 ohms |
| Vent door detector 54 | 250 ohms |
| Power Saver Detector 56 | 650 ohms |
| Thermostat Potentiometer 58 | 0–2.2 K ohms |

The circuit 10, therefore, detects the status, condition or setting of each of the manually adjustable operating parameters of the air conditioner which can have a measurable effect upon long term energy consumption. The detected condition of each such parameter is integrated by the circuit 10 in an additive manner to provide an electric current through the meter 40 representative of the combined effects of each parameter setting upon such energy consumption. A change in the condition or setting of any of these parameters is translated into a change in either the condition of a corresponding detector resistor shorting switch or change in the setting of a corresponding detector potentiometer. This, in turn, alters the total detector resistance of the circuit 10 and deflection of the meter 40.

Integration of the detected parameter conditions or settings can also be obtained by employing a multiplicative integrator circuit if desired. However, while such as integrator circuit may provide somewhat more accurate galvanometer deflections than those produced by the additive integrator of circuit 10, the former is more complex requiring use of active amplifier elements as well as passive detector resistors.

In determining the proper resistance values for each of the detector resistors in the circuit 10, it is first necessary to determine the percentage change in long term energy consumption contributed by changes in each of the operator controlled parameters. This can only be determined by performing tests upon the particular model and type air conditioner with which the circuit 10 is to be employed. In the case of the General Electric DE 914 of the present example, laboratory analysis of the unit indicated the per unit contributions of each parameter to total operator controllable energy consumption as set forth in TABLE II.

TABLE II

| CONTROL PARAMETER | PER UNIT CONTRIBUTION TO CONTROLLABLE ENERGY CONSUMPTION |
| --- | --- |
| Thermostat 16 | 0.66 |
| Power Saver Switch 18 | 0.20 |
| Vent Door 64 | 0.08 |
| Fan Speed Change (low to medium) | 0.03 |
| Fan Speed Change (medium to high) | 0.03 |
| | 1.00 |

In other words, assume that the maximum change in energy consumption caused by changing all of the parameters from their most efficient to their most inefficient settings is 100 percent of the operator controllable energy comfort operation. Of this 100 percent change in efficiency, a change in the setting of the thermostat 16 from its highest setting to its lowest setting will contribute 66 percent. By comparison, a change in the speed of the fan motor 14 from low to medium will contribute a 3 percent change to the total efficiency change available. The ratio of the value of each corresponding detector resistor to the total value of all of the detector resistors should bear approximately the same percentage values as indicated in TABLE II. For example, the thermostat detector potentiometer 58 should have a maximum resistance value which is approximately 66 percent of the total value of all of the resistances in the detector branch of the circuit 10. Correspondingly, the fan motor speed detector resistors 50, 52 should each have a resistance value equal to about 3 percent of the total resistance value of all of the detector resistors and the potentiometer. Deviations of up to about 10 percent in these resistance values will be acceptable in most instances.

It is also preferable to establish the values of the resistive elements of the circuit 10 such that current flow through the meter 40 will never be greater than about 10 percent of the current flow through the detector resistor branch. One final rule that should preferably be observed is to provide a sufficiently high value of bias resistor 48 such that the maximum voltage drop across the parallel combination of elements in the circuit 10 will never exceed 10 percent of the voltage drop across the bias resistor 48. Failure to follow these rules may result in undesirable non-linear behavior of the meter 40, and inaccurate changes in its deflections which are not reasonably in proportion to corresponding changes in energy consumption caused by changes in the operator controlled parameters. The latter problem may cause the meter 40 to deflect in such a way as to indicate that a change in a given parameter is having a substantially greater or lesser effect on long term energy consumption than is actually the case.

Although the subject invention has been described with respect to specific details of a certain preferred embodiment thereof, it is not intended that such details limit the scope of the subject invention otherwise than as set forth in the following claims.

I claim:

1. A cooling efficiency circuit for an air conditioner of the type having a plurality of manually adjustable parameters, changes in which parameters result in changes in the long term energy consumption of said air conditioner, said circuit comprising means for detecting the status of each of said parameters, integrating means responsive to said detecting means for generating an analog signal representative of the combined effects of each parameter upon said energy consumption, and means for displaying said signal for providing an indication of a change in said energy consumption caused by a change in the status of said parameters.

2. The circuit of claim 1 wherein said integrating means comprises a plurality of detector resistors, each of said resistors being representative of a different one of said parameters, said detector resistors being connected together to form a first series combination, a d.c. galvanometer, a sensitivity resistor connected to said galvanometer to form a second series combination, said first and second combinations being connected in parallel.

3. The circuit of claim 2 wherein said detecting means comprises a plurality of switches for altering the resistance contributed by each of said detector resistors to said first series combination in response to a change in the status of a different one of said parameters.

4. The circuit of claim 2 wherein said plurality of detector resistors comprises a first fan motor speed detector resistor, a second fan motor speed detector resistor, a vent door detector resistor, a thermostat setting detector potentiometer, a plurality of switches, each of said switches being connected across a different one of said detector resistors, said switches being switchable in response to a change in the status of a different one of said parameters, said potentiometer being variable in response to a change in a thermostat setting.

* * * * *